United States Patent [19]
Nishimura

[11] Patent Number: 5,901,077
[45] Date of Patent: May 4, 1999

[54] SEMICONDUCTOR MEMORY DEVICE COMPRISING FERROELECTRIC CAPACITORS

[75] Inventor: Kiyoshi Nishimura, Kyoto, Japan

[73] Assignee: Rohm Co., Ltd., Kyoto, Japan

[21] Appl. No.: 08/918,538

[22] Filed: Aug. 22, 1997

[30] Foreign Application Priority Data

Aug. 23, 1996 [JP] Japan .................................. 8-222852

[51] Int. Cl.⁶ .................................................. G11C 11/22
[52] U.S. Cl. ........................................... 365/145; 365/149
[58] Field of Search ..................... 365/145, 149, 365/189.01, 189.07

[56] References Cited

U.S. PATENT DOCUMENTS

| | | | |
|---|---|---|---|
| 5,341,325 | 8/1994 | Nakano et al. ........................... | 365/145 |
| 5,572,459 | 11/1996 | Wilson et al. ........................... | 365/145 |
| 5,640,030 | 6/1997 | Kenney .................................... | 365/145 |
| 5,668,753 | 9/1997 | Koike ...................................... | 365/145 |

*Primary Examiner*—David Nelms
*Assistant Examiner*—David Lam
*Attorney, Agent, or Firm*—Majestic, Parsons, Siebert & Hsue P.C.

[57] ABSTRACT

A semiconductor memory device has a plurality of memory cells, each having a ferroelectric memory capacitor, arranged in a matrix formation in rows and columns. A read-out device is associated with each row for reading out data stored in a selected one of the memory cells in the row based on voltages generated by the ferroelectric capacitor belonging to that selected memory cell and a plurality of divided ferroelectric capacitors which are distributed in the direction of the rows such that piezoelectric effects on the ferroelectric capacitors will be diminished.

14 Claims, 13 Drawing Sheets

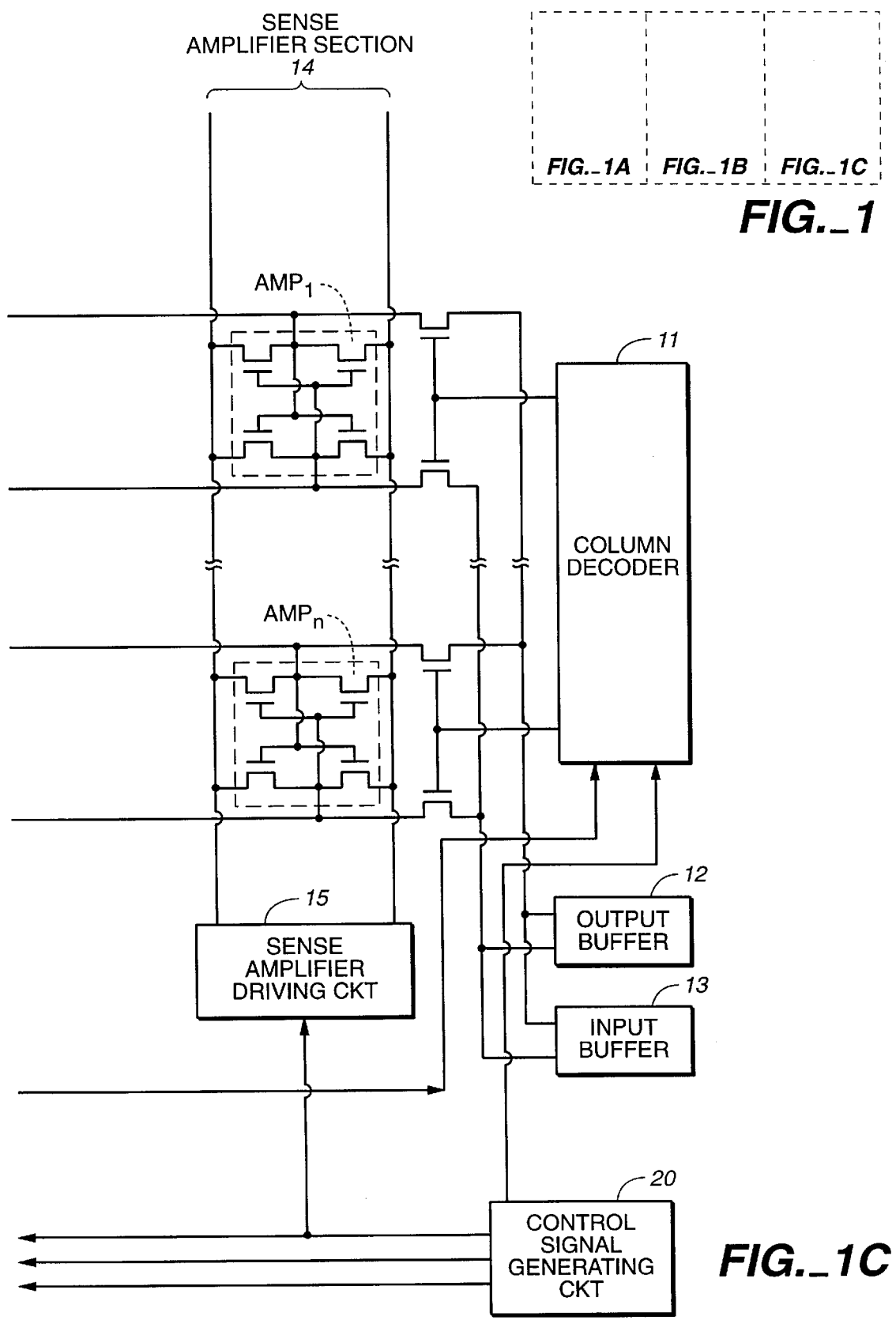

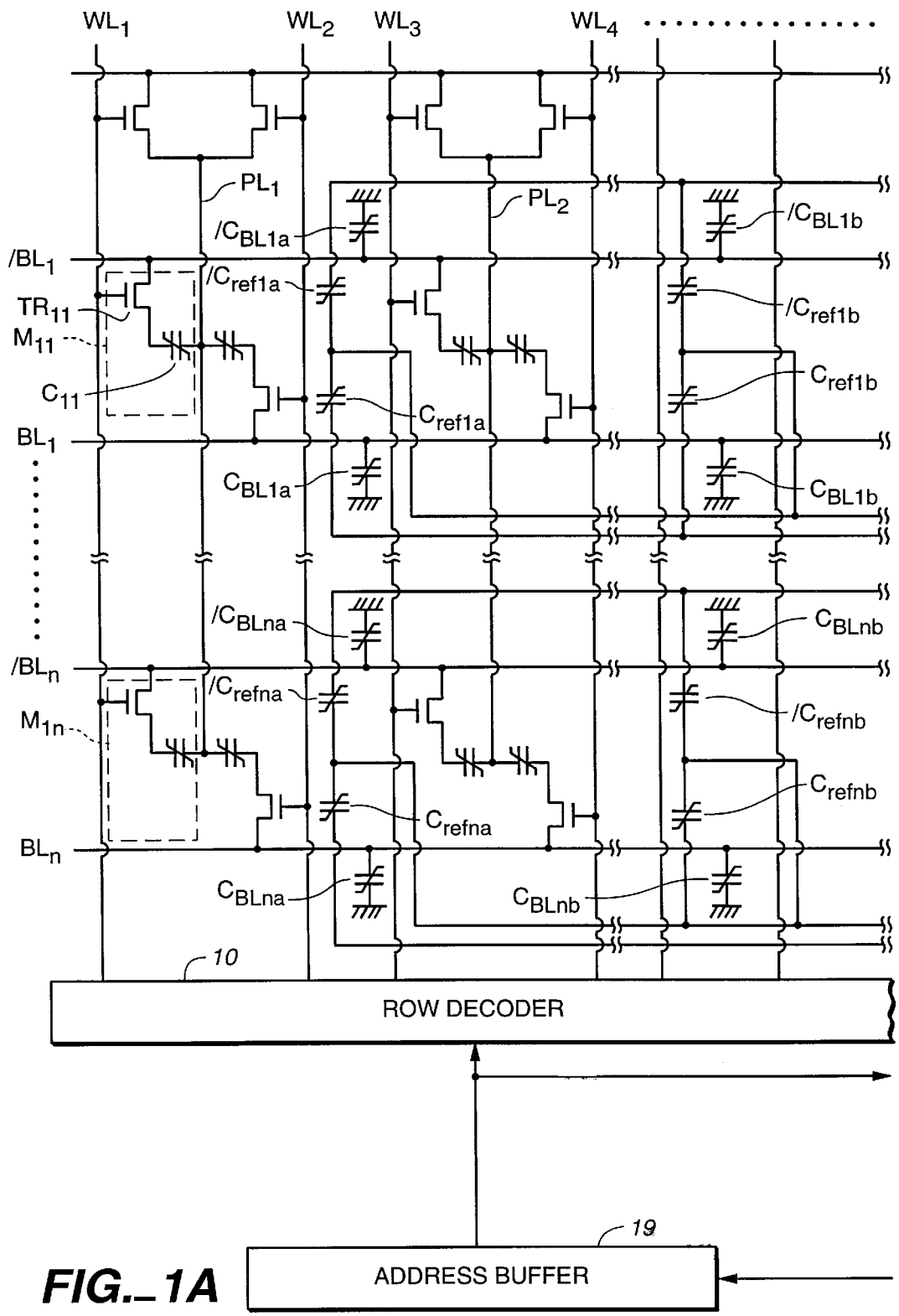
FIG._1A

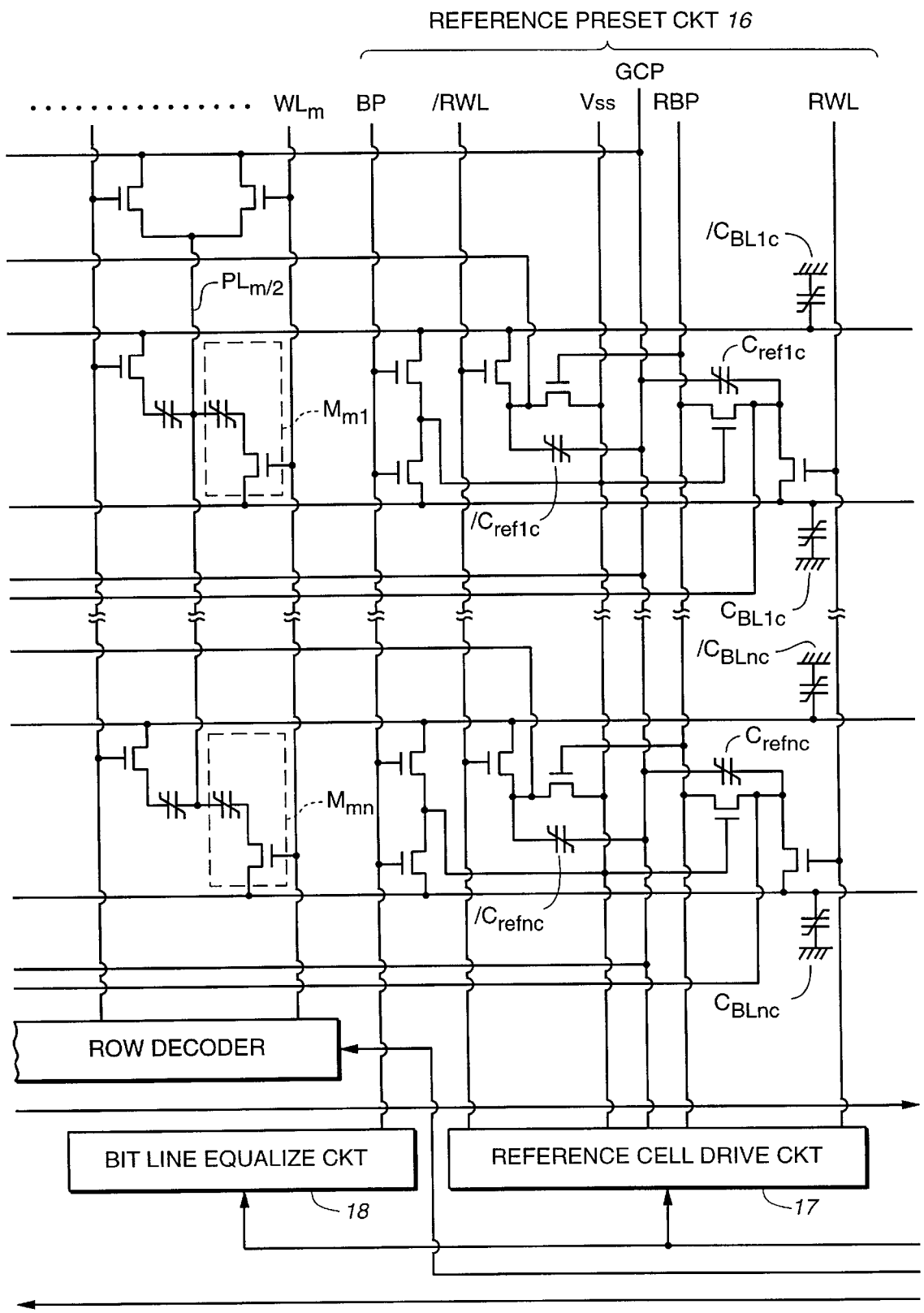
FIG._1B

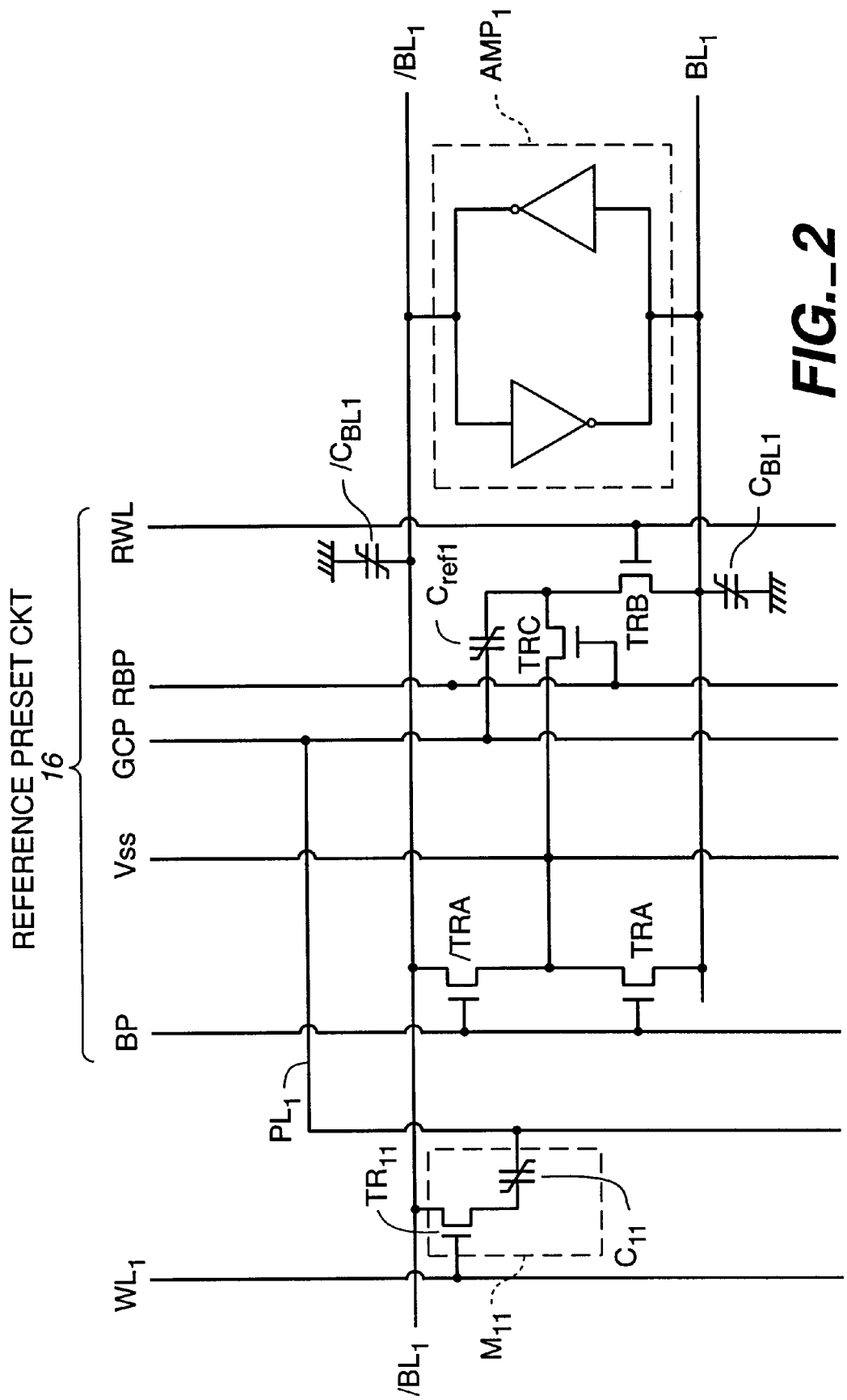
FIG._2

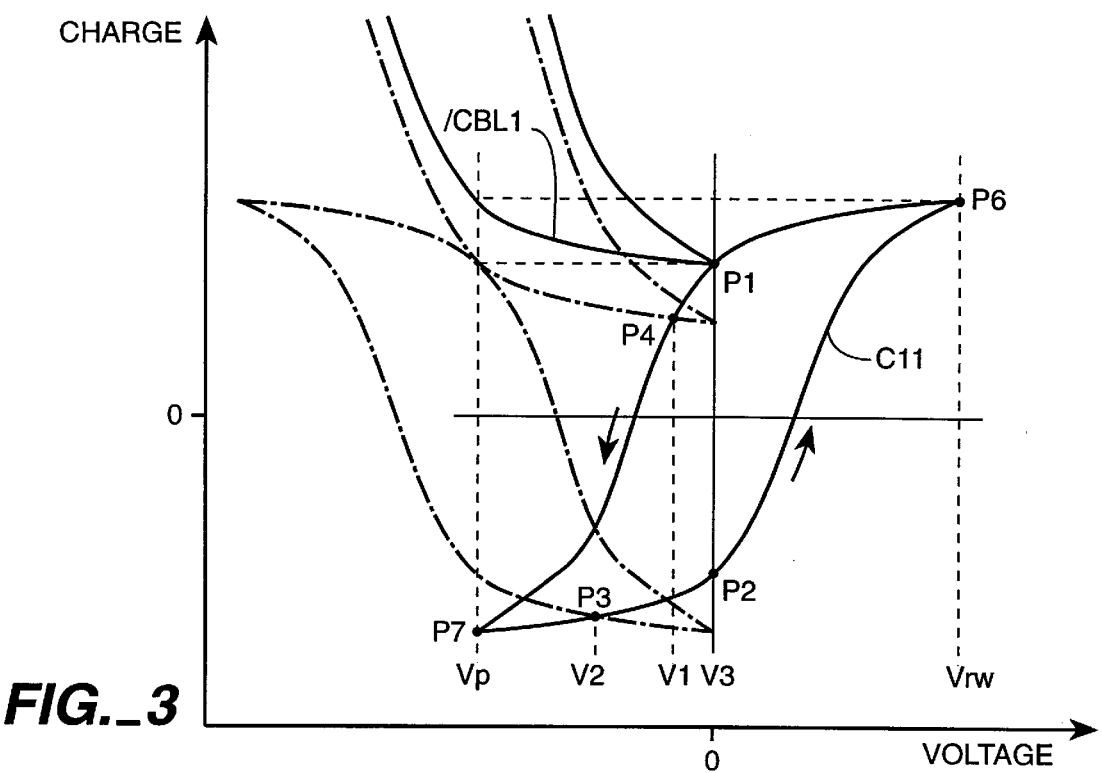
FIG._3
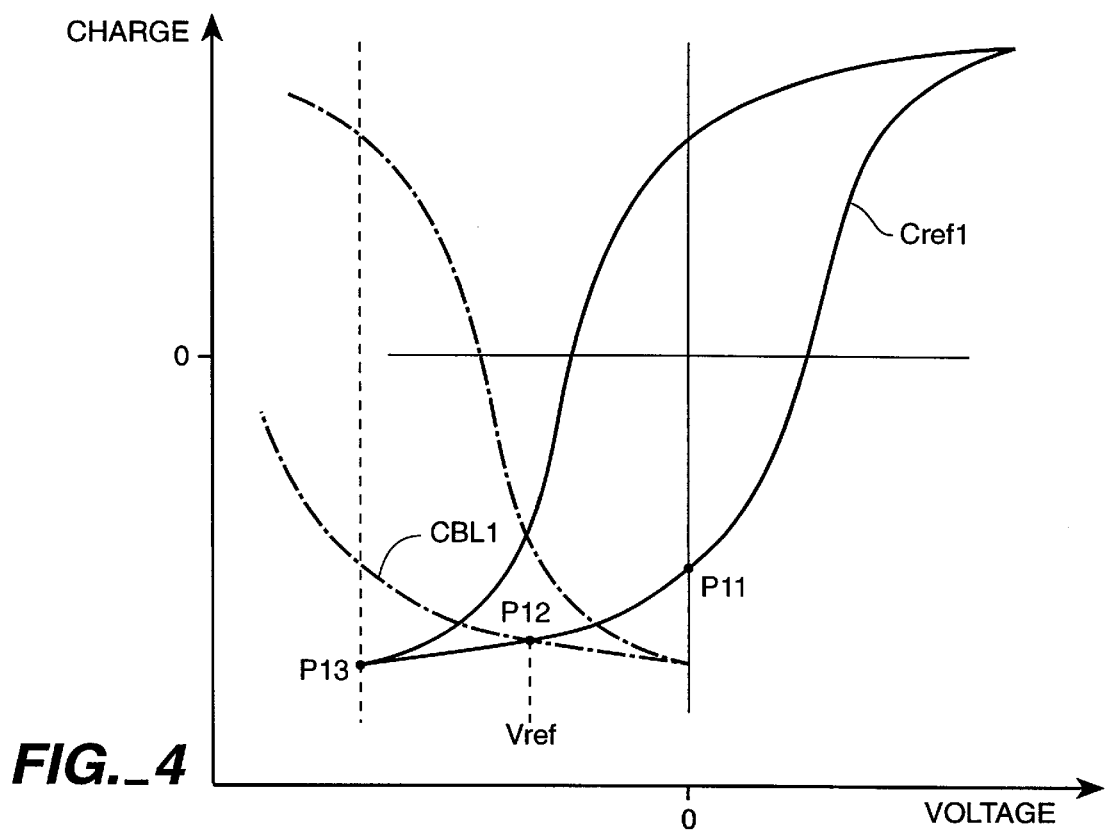
FIG._4

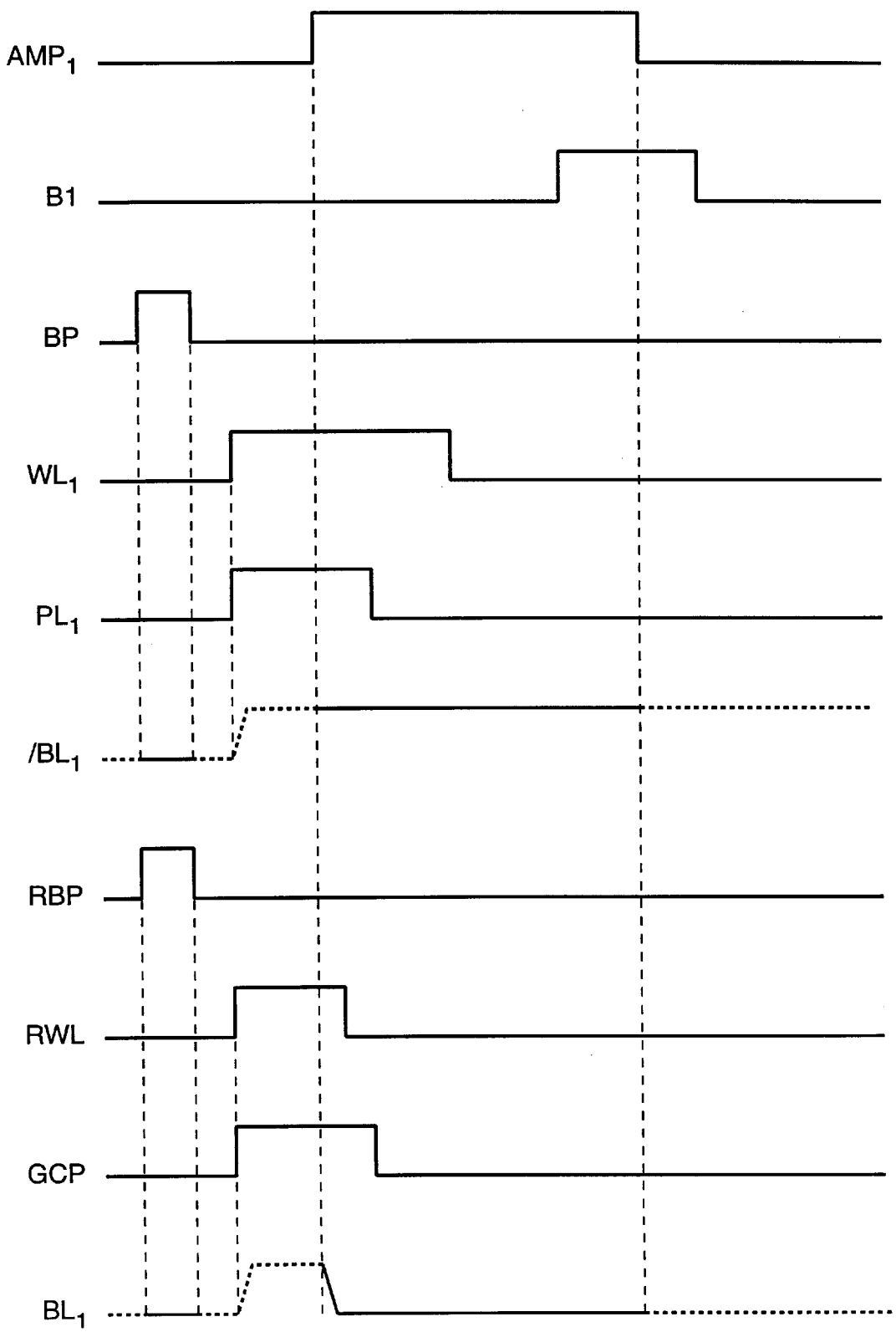
FIG._5

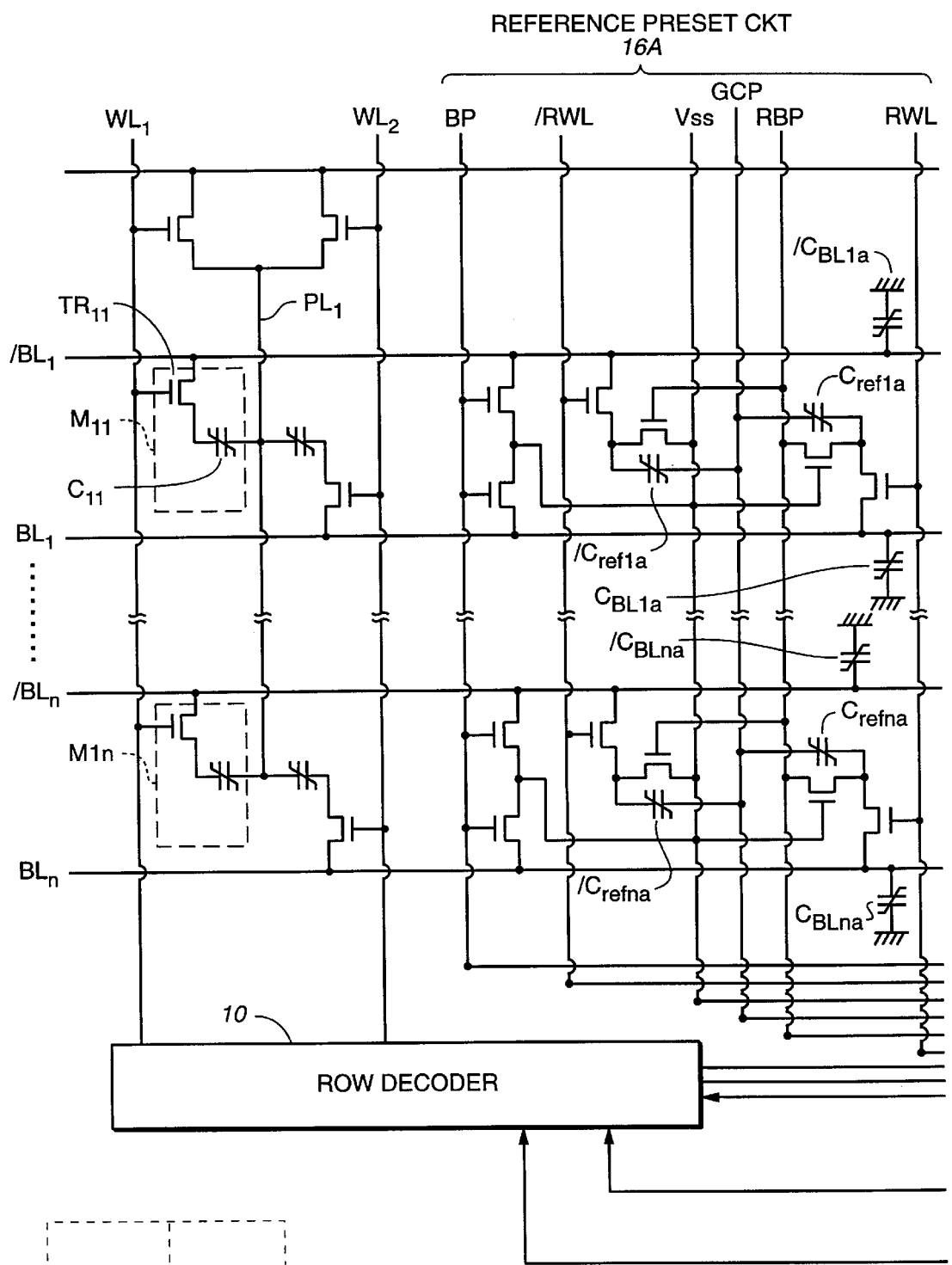
FIG._6A
FIG._6

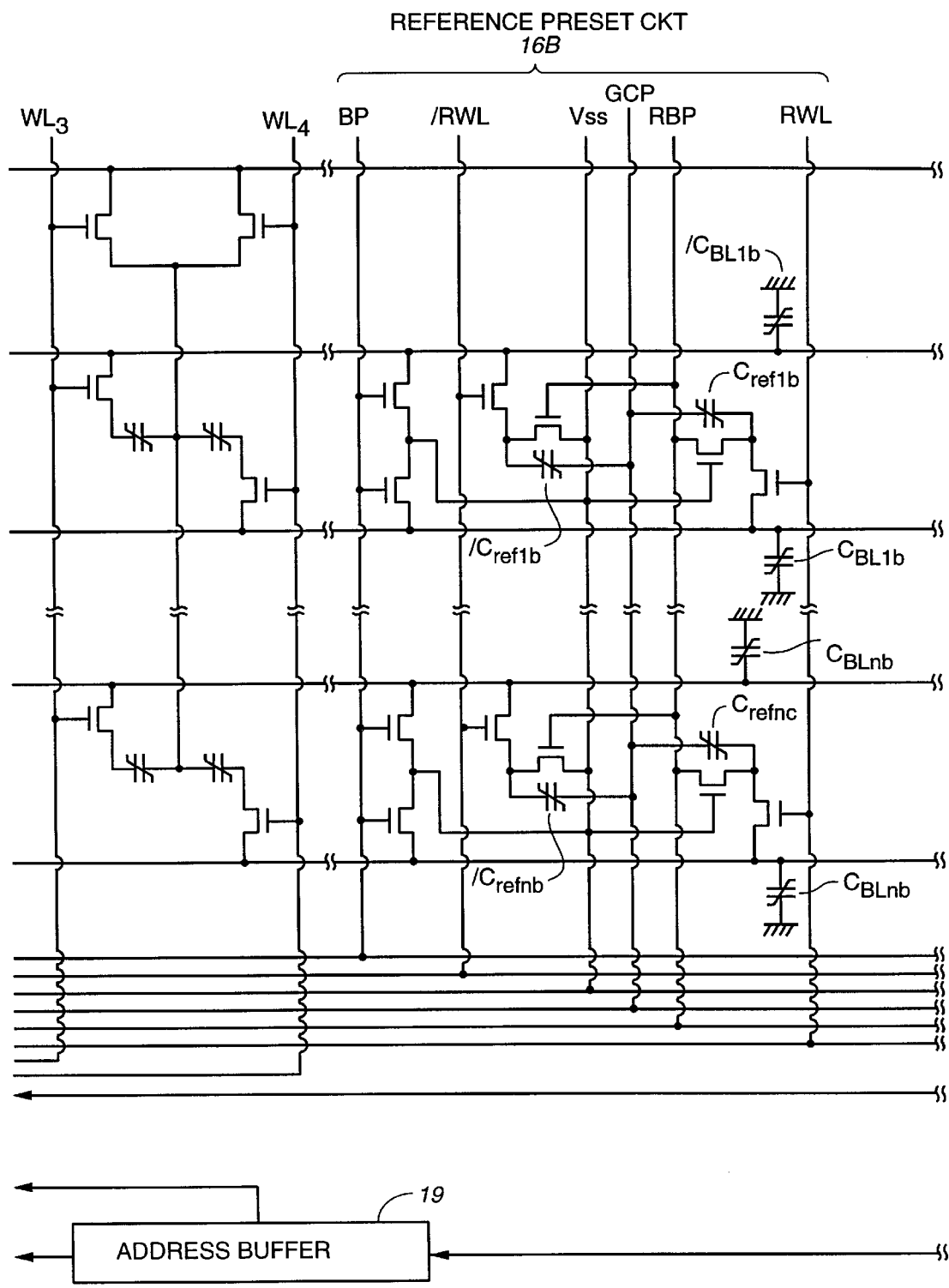
FIG._6B

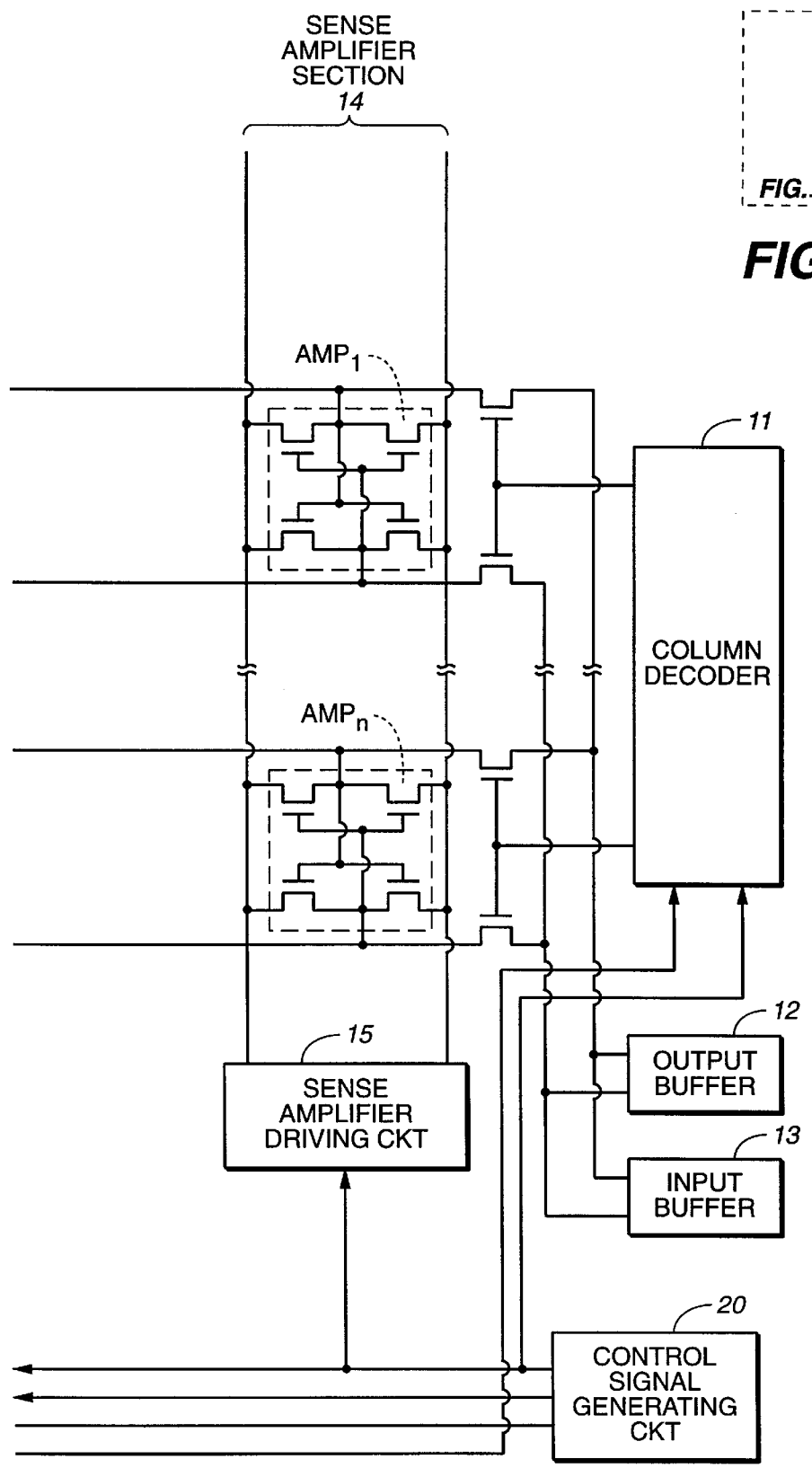
FIG._7
FIG._7B

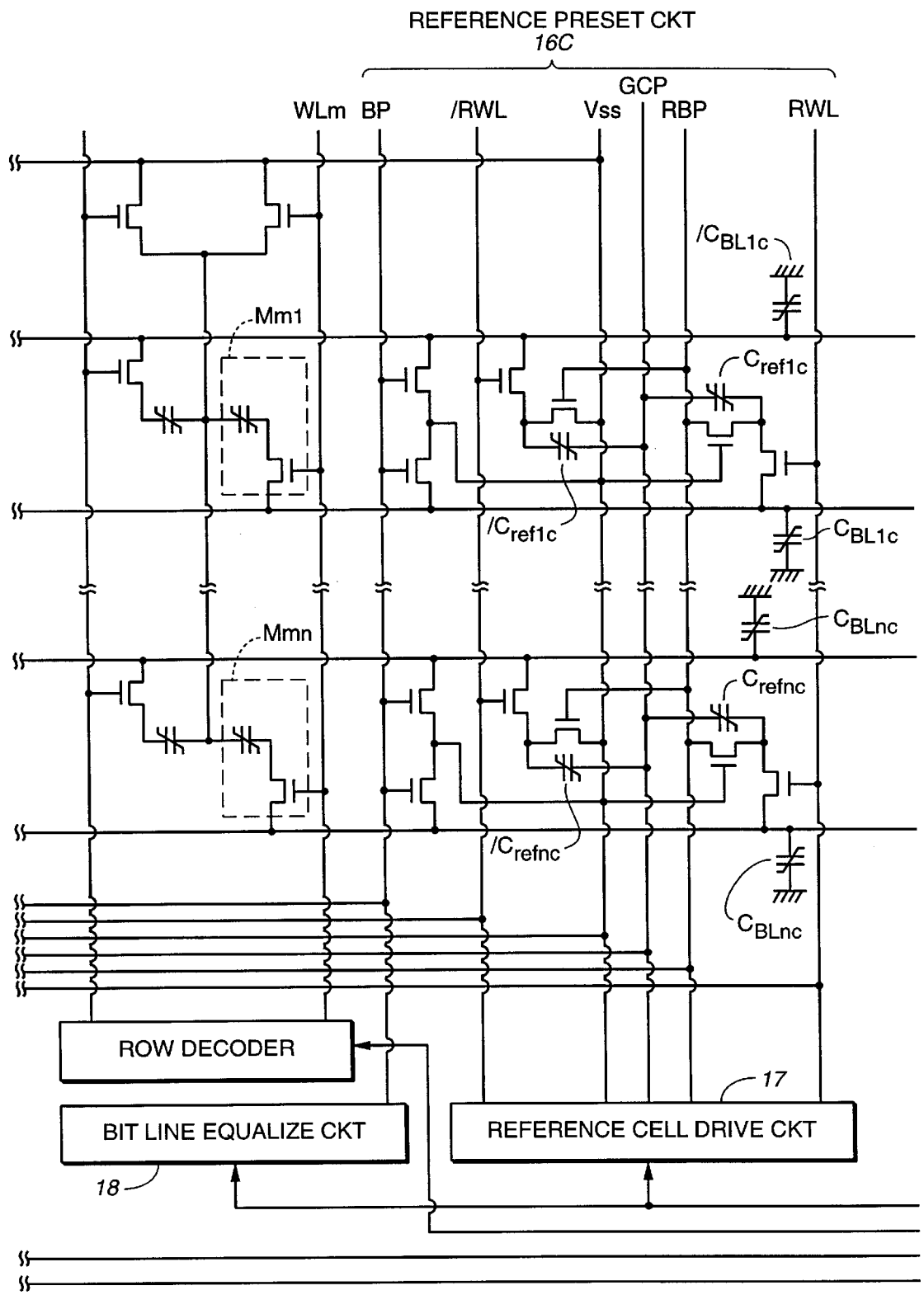
FIG._7A

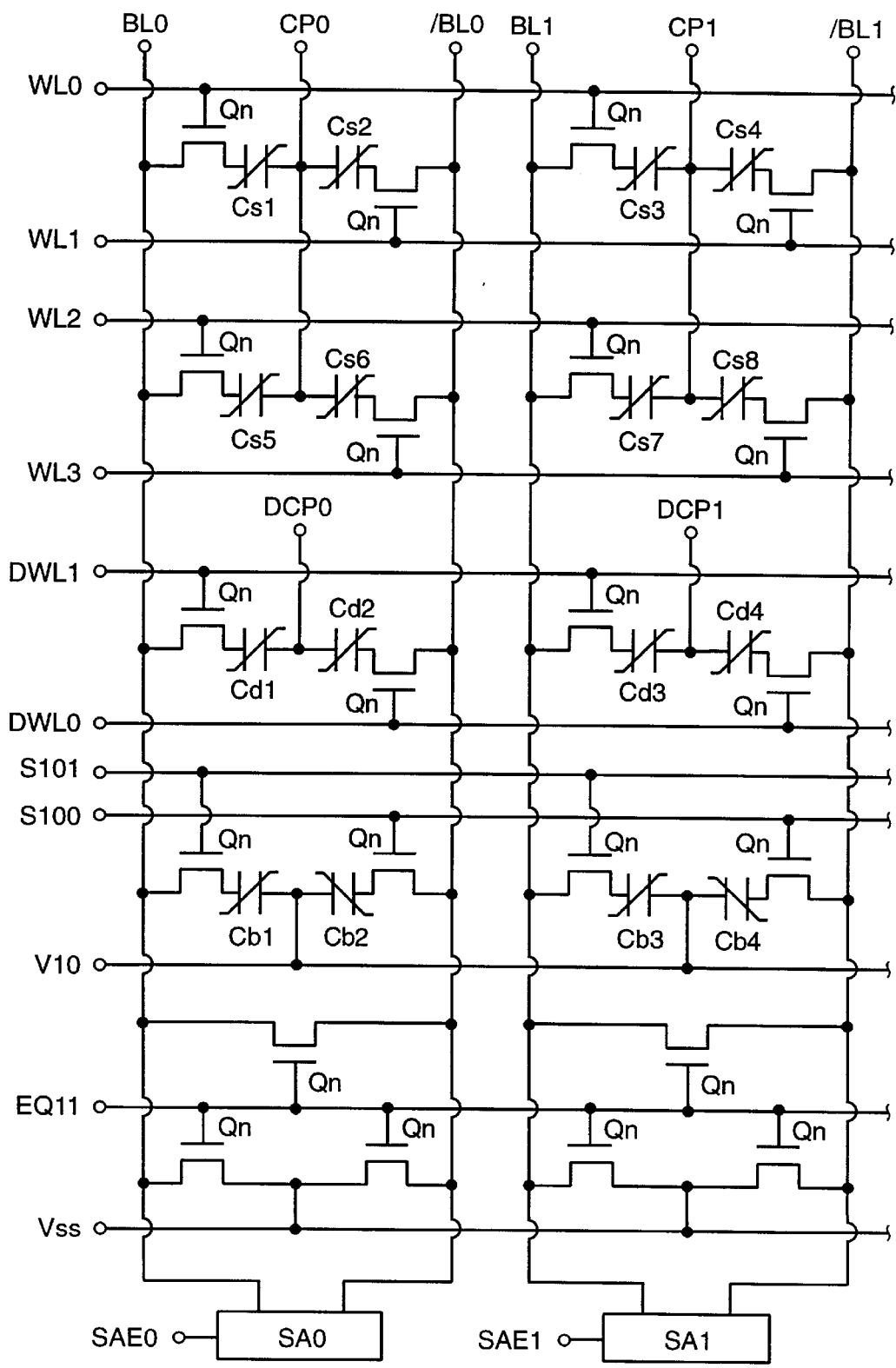
FIG._8
*(PRIOR ART)*

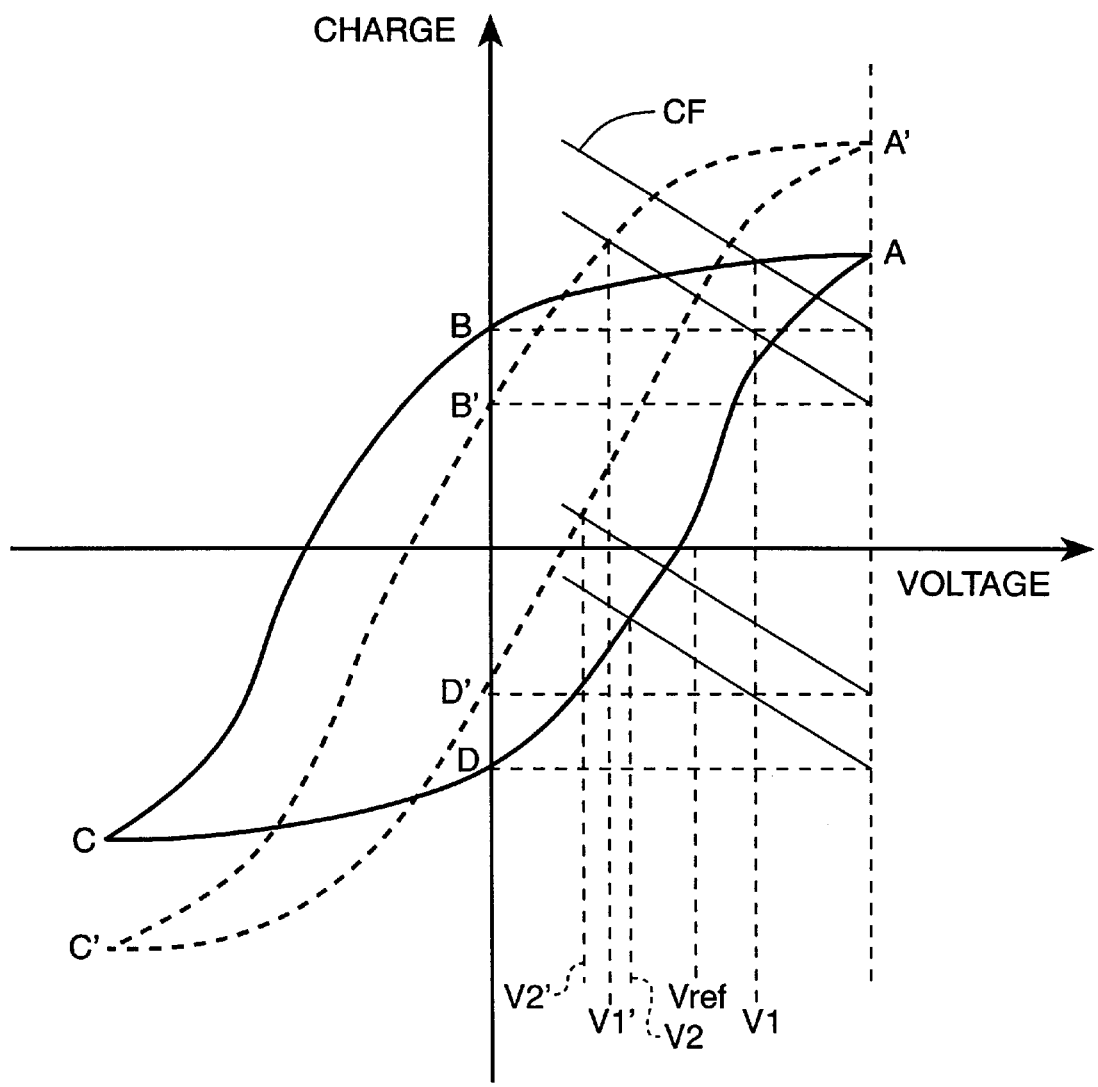
FIG._9
*(PRIOR ART)*

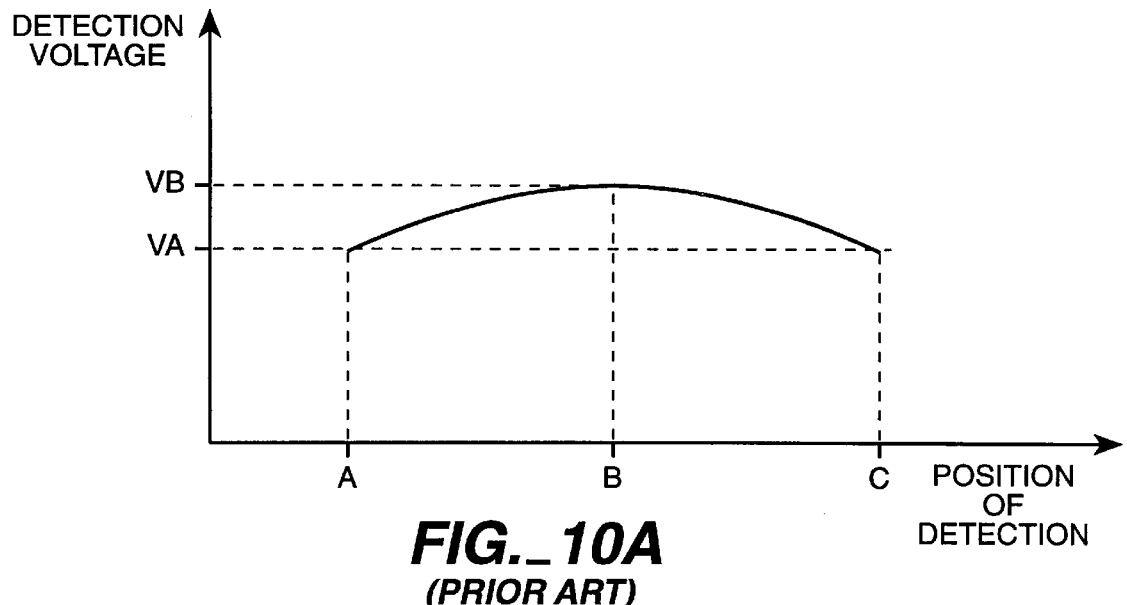
FIG._10A
*(PRIOR ART)*
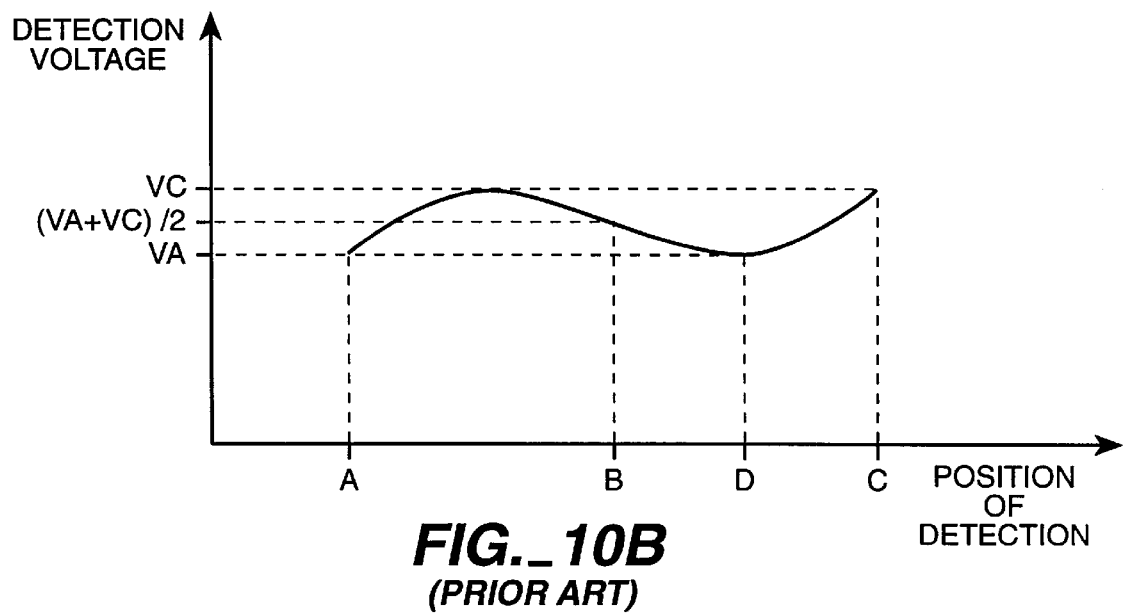
FIG._10B
*(PRIOR ART)*

SEMICONDUCTOR MEMORY DEVICE COMPRISING FERROELECTRIC CAPACITORS

BACKGROUND OF THE INVENTION

This invention relates to a semiconductor memory device comprising ferroelectric capacitors.

With the development of computers, semiconductor memory devices are becoming popular for storing data and programs. Examples of semiconductor memory device include RAM (random access memory) devices such as DRAM and SRAM and ROM (read only memory) devices such as mask ROM and PROM. ROMs are usually non-volatile such that the data-storing condition is maintained even if the device is disconnected from a power source. PROM (programmable read only memory) devices are becoming particularly popular because the use can freely write in data. EEPROM (electrically erasable PROM) devices are particularly expected to become-popular because data can be written in electrically.

One of known methods of producing an EEPROM has been to make use of the MIS-FET (metal-insulator-semiconductor field effect transistor) structure, maintaining a data-storing condition by charge injection from a silicon substrate or charge discharge to the substrate by using a trap region inside the gate insulator membrane or a floating gate. Another method has been to apply a high voltage to a ferroelectric membrane to cause spontaneous polarization. Examples of the method of using a ferroelectric member include the method of causing spontaneous polarization of a ferroelectric member serving as a gate insulator membrane by applying a high gate voltage by using its MFS-FET (metal-ferroelectric-semiconductor FET) structure, as well as the method of using a ferroelectric material instead of an oxide membrane as capacitor in a DRAM-like circuit structure. The latter method, in particular, is being actively developed recently because it is possible to provide non-volatility while taking advantage of the merit that the cell structure is simple, being similar to a DRAM.

As an example of semiconductor memory device with a DRAM-like circuit structure and using ferroelectric capacitors, Japanese Patent Publication Tokkai 8-36888 disclosed a circuit structure as shown in FIG. 8, wherein WL0–WL3 are word lines, DWL0–DWL1 are dummy word lines, BL0, /BL0, BL1 and /BL1 are bit lines, CP0 and CP1 are plate lines, DCP0 and DCPL are dummy plate lines, EQ11 indicates a bit equalize and precharge control signal, S100 and S101 indicate control signals, V10 indicates a signal, SAE0 and SAE1 indicate sense amplifier control signals, $V_{ss}$ indicates a grounding voltage, SA0 and SA1 are sense amplifiers, Cs1–Cs8 are main body memory cell ferroelectric capacitors, Cd1–Cd4 are dummy memory cell ferroelectric capacitors, Cb1–Cb4 are bit line capacitance adjusting capacitors each comprising an ordinary capacitor or a ferroelectric capacitor, and Qn is an N-channel type MOS transistor.

In order to read out data with a circuit structure as described above, the word lines WL0–WL3, the dummy word lines DWL0 and DWL1, the plate lines CPO and CP1, the dummy plate lines DCP0 and DCP1, the sense amplifier control signals SAE0 and SAE1 and the control signals S100 and S101 are set to logical voltage "L", the bit equalize and precharge control signal EQ11 is set to logical voltage "H" and the bit lines BL0, /BL0, BL1 and /BL1 are set to logical voltage "L" as initial condition. Next, the signal EQ11 is set to "L" such that the bit lines BL0, /BL0, BL1 and /BL1 are in a floating condition. If it is desired now to read the main body memory cell capacitor Cs2, word line WL1, dummy word line DWL1, plate line CP0, dummy plate line DCP0 and control signal S101 are all set to "H" such that the MOS transistor Qn is activated and the data signal from the dummy memory cell is outputted to the bit line BL0 and the data signal from the main body memory cell is outputted to the bit line /BL0. In this situation, the control signal S101 becomes "H" such that the bit line BL0 becomes connected to the bit line capacitance adjusting capacitors but the circuit is so set that a suitable reference voltage can be obtained by setting the signal V10 at an appropriate voltage to increase the capacitance of the bit line BL0 even if the dummy memory cell capacitor and the main body memory cell capacitor are about the same. If the sense amplifier control signal SAEO is thereafter set to "H" to activate the sense amplifier SA0, the data on the bit lines BL0 and/BL0 are compared and amplified and the memory stored in the capacitor Cs2 is outputted.

As explained above, ferroelectric capacitors function as a non-volatile memory device by making use of residual spontaneous polarization of a ferroelectric material. FIG. 9 shows the hysteresis characteristic of a ferroelectric material, the horizontal axis representing the voltage which is applied to the material and the vertical axis representing the charge as an equivalent of its polarization condition. The solid curve represents the characteristic when no pressure is applied to the ferroelectric material, and the dotted curve represents the characteristic when the material is subjected to a pressure.

As shown by Points B and D on the solid curve of FIG. 9, a ferroelectric material has residual polarization even when the applied voltage is "0". If a sufficiently large positive voltage is applied when the material is at Point "D", its condition changed to Point "A". If the applied voltage is thereafter reduced to "0", the condition of the material does not return to Point "D" but moves to Point "B". If a positive voltage is applied again under this condition, the polarization condition of the material changes only from Point "B" to Point "A", but if a sufficiently large negative voltage is applied first and then the voltage is returned to "0", the polarization condition goes back to Point "D". Such a material can be used as a memory device by corresponding the polarization conditions of Points "B" and "D" with logical values "1" and "0".

Ferroelectric materials, however, also have a piezoelectric characteristic, causing voltage variations when subjected to external pressure. As shown in FIG. 9, for example, the hysteresis characteristic of the ferroelectric material may change from the curve shown by solid lines to the truncated curve shown by dotted lines. The accumulated charge may increase at Points "A" and "C" to Points "A'" and "C'" but Points "B" and "D" corresponding to a zero-voltage situation may move to Points "B'" and "D'" as shown, the accumulated charge becoming smaller.

Let us now consider the shift in the read-out voltage. If $C_p$ represents the load capacitance in FIG. 9, the read-out voltages are graphically obtained as $V_1$ and $V_2$ when there is no external pressure. In other words, this material can function as a memory device by setting the reference voltage $V_{ref}$ between $V_1$ and $V_2$ as shown in FIG. 9, $V_1$ and $V_2$ corresponding to logical values "1" and "0". When the ferroelectric material is under pressure, however, voltages $V_1'$ and $V_2'$ are similarly obtained from FIG. 9, but since $V_1'$ is smaller than $V_{ref}$, it is likely to be interpreted as logical value "0".

FIGS. 10A and 10B show schematically the voltage shifts due to piezoelectric properties of ferroelectric material caused when external pressure is applied to a semiconductor memory device, the horizontal axes representing the positions of detection and the vertical axes representing the detection voltage. As shown, the detection voltage changes according to the applied distortion pressure at each detection position.

Consider FIG. 10A, for example. When the dummy memory cell capacitors and the bit line capacitance adjusting capacitors in the circuit of FIG. 8 are in a condition indicated by Point "A" of FIG. 9, the voltage difference between the reference voltage generated from these capacitors and the detection voltage $V_A$ is used for the memory read-out. If there is a memory cell in a condition of Point "C", there is no problem in comparing with the reference voltage because the detection voltage is $V_A$, being the same as Point "A". In the case of a memory cell in a condition of Point "B", however, there is an error of $(V_A-V_B)$ to be taken into consideration when a comparison is made with the reference voltage because the detection voltage is $V_B$.

Consider FIG. 10B next. When the dummy memory cell capacitors and the bit line capacitance adjusting capacitors in the circuit of FIG. 8 are in a condition indicated by Point "A" of FIG. 9, there is no problem with a memory cell at Position "D", but a maximum error of $(V_A-V_C)$ should be expected for memory cells in other conditions.

In summary, the read-out margin of a ferroelectric is lowered due to an external force, as shown in FIG. 9, and when an external force is applied unevenly on a packaged semiconductor memory device, shear pressure is applied locally thereon and different voltage differences will be experienced, depending on the distribution of the memory cells, as shown in FIGS. 10A and 10B. In particular when a pressure is locally applied on ferroelectric capacitors which are located only in one limited region such as the dummy memory cell capacitors and the bit line capacitance adjusting capacitors in the semiconductor memory device of FIG. 8, the read-out margin is reduced and, in worse situations, errors can occur in the read-out of data. In general, the read-out of information from a ferroelectric memory device is by destroying the stored data item and a data-rewrite is required after the data item has been read. Thus, if the data item stored in a ferroelectric memory device is incorrectly read out, an incorrect data item will be received thereafter and stored in the memory device.

SUMMARY OF THE INVENTION

It is therefore an object of this invention to eliminate the problem of prior art semiconductor memory devices as described above. A semiconductor memory device embodying this invention, with which the above and other objects can be accomplished, may be characterized as comprising not only a plurality of memory cells each having a ferroelectric memory capacitor and arranged in a matrix formation in rows and columns, but also read-out means each associated with one of these rows for reading out data stored in a selected one of the memory cells in the associated row based on voltages generated by the ferroelectric capacitor belonging to the selected memory cell and a plurality of divided ferroelectric capacitors which are distributed in the direction of the rows. These "divided" ferroelectric capacitors may be capacitors divided from a ferroelectric reference capacitor, a ferroelectric load capacitor which is connected in series to a ferroelectric reference capacitor and/or a ferroelectric load capacitor which is connected in series with the ferroelectric memory capacitor. According to particular embodiments of the present invention, one of such divided ferroelectric capacitors in the middle has one half of the capacitance of the synthesized capacitor and two of them at both end positions of the row have each one quarter of the total capacitance of the synthesized capacitor.

Alternatively, a semiconductor memory device embodying this invention may be characterized as comprising a plurality of memory cells each having a ferroelectric memory capacitor and arranged in a matrix formation in rows and columns and read-out means each associated with one of the rows for reading out data stored in a selected one of the memory cells in the row based on a read-out voltage which is generated by the ferroelectric capacitor belonging to the selected memory cell and a plurality of voltage generating means distributed in the direction of the rows for generating a reference voltage and having divided ferroelectric capacitors distributed in the direction of the rows.

With a semiconductor memory device thus structured having either a plurality of ferroelectric capacitors of a read-out means or a plurality of voltage generating means comprising divided ferroelectric capacities distributed in the direction of the rows, effects of unevenly applied external forces on the memory device are experienced only by a portion of the plurality of ferroelectric capacitors or voltage generating means and hence the overall effect of such external force can be reduced.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a circuit diagram of a semiconductor memory device embodying this invention;

FIG. 2 is a schematic representation of the circuit diagram of FIG. 1;

FIG. 3 is a hysteresis characteristic curve of the ferroelectric memory capacitor;

FIG. 4, is a hysteresis characteristic curve of the ferroelectric reference capacitor;

FIG. 5 is a timing chart for the operation of the circuit shown in FIG. 1;

FIG. 6 is a left-hand half of a circuit diagram of another semiconductor memory device embodying this invention;

FIG. 7 is a right-hand half of the circuit diagram of the semiconductor memory device shown in FIG. 6;

FIG. 8 is a circuit diagram of a prior art semiconductor memory device;

FIG. 9 is a hysteresis characteristic of a ferroelectric material; and

FIGS. 10A and 10B are schematic graphs showing shifts in voltage to a ferroelectric capacitor due to external pressure.

Throughout herein, like components are indicated by like symbols whether they are components of different devices according to different embodiments of the invention, and repetitive explanations are omitted.

DETAILED DESCRIPTION OF THE INVENTION

FIGS. 1 and 2 show a semiconductor memory device embodying this invention, having (m×n) memory cells $M_{11}$, $M_{21}$, ..., $M_{mn}$ arranged in a matrix formation. Each memory cell $M_{ij}$ (where i and j are dummy indices such that i=1, 2, ..., m and j=1, 2, ..., n) comprises a transistor $TR_{ij}$ for selection and a ferroelectric memory capacitor $C_{ij}$. Bit lines $/BL_j$ and $BL_j$ (j=1, 2, ..., n) and word lines $WL_i$ (i=1, 2, ..., m) are extended horizontally and vertically (with respect to the figures). The gates of the selection transistors $TR_{ij}$ and $TR_{i+1j}$ are connected respectively to the word lines $WL_i$ and $WL_{i+1}$. One end of the capacitor $C_{ij}$ is connected through the transistor $TR_{ij}$ to the bit line $/BL_j$ and one end of the capacitor $C_{i+1j}$ is connected through the transistor $TR_{i+1j}$ to the bit line $BL_j$. The other ends of the capacitors $C_{ij}$ and $C_{i+1j}$ are both connected to the plate line $PL_i$ (i=1, 2, ..., m/2).

The word lines $WL_i$ are connected to a row decoder 10, and the bit lines $/BL_j$ and $BL_j$ are connected to an output buffer 12 and an input buffer 13 through a transistor of which the gate is connected to a column decoder. The row decoder 10 and the column decoder 11 serve to identify a particular memory cell by selecting a particular word line WL and bit lines /BL and BL according to address data received from an address buffer 19 and to read out from and to write into the identified memory cell through the output buffer 12 and the input buffer 13.

A reference cell preset circuit 16 is provided not only with a reference cell drive circuit 17 and a bit line equalize circuit 18 but also with ferroelectric reference capacitors $/C_{refj}$ and $C_{refj}$ and ferroelectric load capacitors $/C_{BLj}$ and $C_{BLj}$ for each of bit lines $/BL_j$ and $BL_j$, as shown schematically in FIG. 2.

As shown in FIG. 1, the ferroelectric reference capacitor $/C_{refj}$ is formed as a parallel connection of three mutually divided ferroelectric capacitors $/C_{refja}$, $/C_{refjb}$ and $/C_{refjc}$. Similarly, the ferroelectric reference capacitor $C_{refj}$ is formed as a parallel connection of three mutually divided ferroelectric capacitors $C_{refja}$, $C_{refjb}$ and $C_{refjc}$. The divided ferroelectric capacitors $/C_{refja}$ and $C_{refja}$ are disposed near the left-hand end (near the memory cell $M_{1j}$ in FIG. 1) of the semiconductor memory device. The divided ferroelectric capacitors $/C_{refjb}$ and $C_{refjb}$ are disposed near the center (near the memory cell $M_{m/2j}$ of FIG. 1) of the semiconductor memory device. The divided ferroelectric capacitors $/C_{refjc}$ and $C_{refjc}$ are disposed near the right-hand end (inside the reference cell preset circuit 16 adjacent the memory cell $M_{mj}$ of FIG. 1) of the semiconductor memory device. The ferroelectric reference capacitor $/C_{refj}$ and the three divided ferroelectric capacitors $/C_{refja}$, $/C_{refjb}$ and $/C_{refjc}$ are related as follows:

$/C_{refja} = /C_{refj} \times \frac{1}{4}$ (Left-hand side)

$/C_{refjb} = /C_{refj} \times \frac{1}{2}$ (Center)

$/C_{refjc} = /C_{refj} \times \frac{1}{4}$ (Right-hand side)

Since the three divided capacitors are connected in parallel, $/C_{refja} + /C_{refjb} + /C_{refjc} = /C_{refj}$.

Similarly, the ferroelectric reference capacitor $C_{refj}$ and the three divided ferroelectric capacitors $C_{refja}$, $C_{refjb}$ and $C_{refjc}$ are related as follows:

$C_{refja} = C_{refj} \times \frac{1}{4}$ (Left-hand side)

$C_{refjb} = C_{refj} \times \frac{1}{2}$ (Center)

$C_{refjc} = C_{refj} \times \frac{1}{4}$ (Right-hand side)

Since the three divided capacitors are connected in parallel, $C_{refja} + C_{refjb} + C_{refjc} = C_{refj}$.

The ferroelectric load capacitors $/C_{BLj}$ and $C_{BLj}$ are similarly each formed as a parallel connection of three mutually divided ferroelectric capacitors $/C_{BLja}$, $/C_{BLjb}$ and $/C_{BLjc}$ and three mutually divided ferroelectric capacitors $C_{BLja}$, $C_{BLjb}$ and $C_{BLjc}$, among which there are the following relationships:

$/C_{BLja} = /C_{BLj} \times \frac{1}{4}$ (Left-hand side)

$/C_{BLjb} = /C_{BLj} \times \frac{1}{2}$ (Center)

$/C_{BLjc} = /C_{BLj} \times \frac{1}{4}$ (Right-hand side)

$/C_{BLja} + /C_{BLjb} + /C_{BLjc} = /C_{BLj}$ $C_{BLja} = C_{BLj} \times \frac{1}{4}$ (Left-hand side)

$C_{BLjb} = C_{BLj} \times \frac{1}{2}$ (Center)

$C_{BLjc} = C_{BLj} \times \frac{1}{4}$ (Right-hand side)

$C_{BLja} + C_{BLjb} + C_{BLjc} = C_{BLj}$

The reference cell drive circuit 17 includes line GCP, grounding line $V_{ss}$, line RBP and lines /RWL and RWL. The bit line equalize circuit 18 includes line BP. Line GCP is connected to the plate lines $PL_i$ through transistors of which the gates are connected to the word lines $W_{Li}$. Line BP is connected to the gates of transistors /TRA and TRA. The source and the drain of the transistor /TRS are connected to the bit line $/BL_j$ and the grounding line $V_{ss}$. The source and the drain of the transistor TRA are connected to the bit line $BL_j$ and the grounding line $V_{ss}$.

The ferroelectric reference capacitor $/C_{refj}$ has one end connected to the line GCP and the other end connected both to the bit line $/BL_j$ through a transistor /TRB of which the gate is connected to the line /RWL and also to the grounding line $V_{ss}$ through a transistor /TRC of which the gate is connected to the line RBP. The ferroelectric reference capacitor $C_{refj}$ has one end connected to the line GCP and the other end connected both to the bit line $BL_j$ through a transistor TRB of which the gate is connected to the line RWL and also to the grounding line $V_{ss}$ through a transistor TRC of which the gate is connected to the line RBP. The ferroelectric load capacitors $/C_{BLj}$ and $C_{BLj}$ have one end connected respectively to the bit lines $/BL_j$ and $BL_j$ and the other end grounded.

There is a sense amplifier section 14 provided with a sense amplifier driving circuit 15 and sense amplifiers $AMP_j$ individually for the bit lines $/BL_j$ and $BL_j$. The sense amplifiers AMPj are connected to the reference cell preset circuit 16 each by having one end connected to the bit line $/BL_j$ and the other end connected to the bit line $BL_j$. The row decoder 10, the column decoder 11, the sense amplifier driving circuit 15, the reference cell driving circuit 17, the bit line equalize circuit 18 and the address buffer 19 are controlled by a control signal generating circuit 20.

Next, the read-out operation of the semiconductor memory device described above will be explained with reference to FIG. 5. Consider a situation, for example, for reading out the memory content "H" of the memory cell $M_{11}$, that is, for ascertaining that the ferroelectric memory capacitor $C_{11}$ is in polarization condition indicated by P6 in FIG. 3. In this situation, after the bit line equalize circuit 18 keeps the line BP at level "H" for a certain length of time, it is returned to level "L" again. This causes the transistors /TRA and TRA to be switched on briefly, and the grounding line VSS is connected to the bit lines $/BL_1$ and $BL1$. During this length of time, the bit lines $/BL_1$ and $BL_1$ are at level "L", and the ferroelectric load capacitors $/C_{BL1}$ and $C_{BL1}$ are discharged in the meantime. Thereafter, when the transistors /TRA and TRA are switched off, the bit lines $/BL_1$ and $BL_1$ are left in a floating condition.

At the same time as the line BP is set to "H" for a specified length of time, the reference cell driving circuit 17 sets the line RBP to "H" for a specified length of time and then set to "L" again. This switches on the transistor TRC briefly, and one end of the ferroelectric reference capacitor $C_{ref1}$, becomes connected to the grounding line $V_{ss}$ to become "L". Since the other end of the ferroelectric reference capacitor $C_{ref1}$ is connected to the line GCP and at level "L", its polarization condition is as shown by Point P11 in FIG. 4.

Next, the reference cell driving circuit 17 sets the line GCP to "H" such that the other end of the ferroelectric reference capacitor $C_{ref1}$ is set to "H" and the read-out voltage Vp is provided. As the row decoder 10 sets the word line $WL_1$ to "H", the plate line $PL_1$ is set to "H" and the read-out voltage vp is applied to the other end of the ferroelectric memory capacitor $C_{11}$. As the word line $WL_1$ reaches "H", the transistor $TR_{11}$, is switched on, and one end of the ferroelectric memory capacitor $C_{11}$ becomes connected in series to the ferroelectric load capacitor $/C_{BL1}$ through the bit line $/BL_1$.

Thus, the read-out voltage Vp is applied both to the ferroelectric memory capacitor $C_{11}$ and the ferroelectric load capacitor $/C_{BL1}$ which are connected together in series, and a partial voltage V3 of the read-out voltage Vp is applied to the ferroelectric memory capacitor $C_{11}$. In FIG. 3, the ferroelectric memory capacitor Cl, is in polarization condition shown by Point P1 at partial voltage V3. In other words, V3=0.

As the word line $WL_1$ is set to "H" as described above, the reference cell driving circuit 17 sets the line RWL to "H" and switches on the transistor TRB. As a result, one end of the ferroelectric reference capacitor $C_{ref1}$, becomes connected in series with the ferroelectric load capacitor $C_{BL1}$ through the bit line $BL_1$. Since the line GCP is kept at "H" by the reference cell driving circuit 17, the read-out voltage Vp is applied to the ferroelectric reference capacitor $C_{ref1}$ and the ferroelectric load capacitor $C_{BL1}$ which are connected in series such that a partial voltage $V_{ref}$ of the read-out voltage Vp is applied to the ferroelectric reference capacitor $C_{ref1}$. With reference to FIG. 4, the polarization condition changes from Point P11 immediately before the connection with the ferroelectric load capacitor $C_{BL1}$ to Point P12.

The sense amplifier $AMP_1$, activated under the condition described above, compares the partial voltage $V_{ref}$ applied to the ferroelectric reference capacitor $C_{ref1}$ through the bit lines $/BL_1$ and $BL_1$ and the partial voltage V3 applied to the ferroelectric memory capacitor $C_{11}$, the bit line at the higher of these two voltages is set to "H" and the bit line at the lower voltage is set to "L". Since the partial voltage V3 is higher than the partial voltage $V_{ref}$, as shown in FIG. 3, the voltage of the bit line $/BL_1$ is set to "H" and the voltage of the bit line $BL_1$ is set to "L". Because the voltage of the bit line $/BL_1$ is "H", the ferroelectric memory capacitor $C_{11}$ stays in the polarization condition of Point P1 in FIG. 3 but the polarization condition of the ferroelectric reference capacitor $C_{ref1}$ shifts to Point P13 of FIG. 4 because the voltage of the bit line $BL_1$ is set to "L".

Next, as the reference cell driving circuit 17 sets the line RWL to "L", the transistor TRB is switched off and the ferroelectric reference capacitor $C_{ref1}$ comes to be in a floating condition. As time passes, the ferroelectric reference capacitor $C_{ref1}$ is discharged and its polarization condition becomes as shown by Point P11 in FIG. 4.

As the line GCP is thereafter set to "L" by the reference cell driving circuit 17, the plate line $PL_1$ is set to "L". Since the voltage of the bit line $/BL_1$ remains at "H", there arises a voltage difference with the plate line $PL_1$, and this voltage difference is applied as a rewrite voltage Vrw to the ferroelectric memory capacitor $C_{11}$, the polarization condition of which then returns to Point P6 of FIG. 3. As for the ferroelectric reference capacitor $C_{ref1}$, its polarization condition does not change although the line GCP is set to "L" because it is in a floating condition. Next, as the row decoder 10 sets the word line $WL_1$ to "L", the transistor $TR_{11}$, is switched off and the ferroelectric memory capacitor $C_{11}$, is set in a floating condition.

Next, the column decoder 11 sets the line $B_1$ to "H" such that the voltage "H" of the bit line $/BL_1$ is taken in by the output buffer 12. Thereafter, the sense amplifier $AMP_1$ is switched off to set the bit lines $/BL_1$ and $BL_1$ in a floating condition. Still thereafter, the column decoder 11 sets the line $B_1$ to "L" to complete the read-out process.

The read-out process described above is a high-speed read-out process carried out before the ferroelectric memory capacitor $C_{11}$ is discharged from the polarization condition of Point P6 shown in FIG. 3. After the ferroelectric memory capacitor $C_{11}$ is discharged and in the polarization condition of Point 1 shown in FIG. 3, the read-out process is also carried out as described above, but the partial voltage based on the read-out voltage Vp of the ferroelectric memory capacitor $C_{11}$ is set at vl shown in FIG. 3 and its polarization condition shifts to Point P4. If the sense amplifier $AMP_1$ thereafter sets the bit line $/BL_1$ to "H", the polarization condition shifts to Point P1. As the rewrite voltage Vrw is applied, the polarization condition returns to Point P6, and after the read-out process is completed, it returns to Point P1 by a discharge.

The read-out process is carried out similarly when the memory content of the memory cell $M_{11}$ is "L", that is, when the polarization condition of the ferroelectric memory capacitor $C_{11}$ is at Point P2 of FIG. 3, except the partial voltage based on the read-out voltage vp of the ferroelectric memory capacitor Cl, is set at V2 as shown in FIG. 3, and its polarization condition changes to Point P3. If the sense amplifier $AMP_1$ thereafter sets the bit line $/BL_1$ at "L", a rewrite voltage Vrw by the voltage difference with the plate line $PL_1$, which has been kept at "H", is applied such that the polarization condition changes to Point P7. After the read-out process is over, the polarization condition returns to Point P2 by a discharge.

As can be understood from the description given above, the reference cell preset circuit 16 serves not only to generate a voltage depending on the stored data on the basis of the ferroelectric memory and load capacitors but also a reference voltage on the basis of the ferroelectric reference and load capacitors, and the sense amplifier section 14, the column decoder 11, etc. serve to output a data signal indicative of the stored data. These circuits are therefore also referred to as read-out means.

Next will be explained the effects of external pressure which may be applied to the semiconductor memory device. While the memory cells $M_{mn}$ are distributed in a matrix formation, the ferroelectric reference capacitors $/C_{refj}$ and $C_{refj}$ and the ferroelectric load capacitors $/C_{BLj}$ and $C_{BLj}$ are divided into parts which are distributed along the bit lines $/BL_j$ and $BL_j$ of the semiconductor device into the left-hand side region, the central region and the right-hand region. Let us now consider a situation where a voltage shift due to a distorting pressure as shown in FIG. 10 has occurred. In the case of a prior art semiconductor device as described above with localized ferroelectric capacitors, there would be no problem in the case of a voltage shift in the direction of the word lines WL but a maximum error of $(V_B-V_A)$ should be expected in the case of FIG. 10A and $(V_c-V_A)$ in the case of FIG. 10B if the voltage shift were in the direction of the bit lines BL.

Let us assume that similar external forces have been applied to the semiconductor device of this invention. Along the bit lines /BL$_j$ and BL$_j$, let us assume that the left-hand side, the center part and the right-hand side correspond respectively to Points A, B and C of FIGS. 10A and 10B. In the case of FIG. 10A, the detection voltages for the ferroelectric memory capacitors C$_{ij}$ of the memory cells fluctuate between V$_A$ and V$_B$ because the memory cells M$_{mn}$ are distributed along the bit lines, but the ferroelectric reference capacitors /C$_{refj}$ are each divided into three parts, as explained above. If the capacitance of a capacitor is reduced to one half of its original value, for example, the charge stored on it, as well as the effect of pressure, also becomes one half. In other words, the effect of pressure is reduced at the same rate at which the capacitor is divided. Thus, the error in the detection voltage becomes V$_A$/4 in the left-hand part, V$_B$/2 in the center part and V$_A$/4 in the right-hand part, and the total error of a ferroelectric reference capacitor /C$_{refj}$ is V$_A$/4+V$_B$/2+V$_A$/4=(V$_A$+V$_B$)/2. Since the detection voltage of the ferroelectric memory capacitor C$_{ij}$ of each memory cell fluctuates between V$_A$ and V$_B$, the error when a comparison is made in the sense amplifier part is V$_A$−(V$_A$+V$_B$)/2=(V$_A$−V$_B$)/2 at detection voltage of V$_A$ and V$_B$−(V$_A$+V$_B$)/2 =(V$_B$−V$_A$)/2 at detection voltage of V$_B$. Thus, the maximum error is $|(V_A-V_B)/2|$, that is, one half of the maximum error in the case of prior art semiconductor memory devices.

Errors can be similarly computed for ferroelectric reference and load capacitors C$_{ref1}$, /C$_{BLj}$ and C$_{BLj}$, and it may be found that the maximum error can be reduced to one half of prior art memory devices.

In the case of FIG. 10B, the error for each divided ferroelectric capacitor is V$_A$/2 in the left-hand part, ((V$_A$+V$_c$)/2)/2 in the center part and V$_c$/4 in the right-hand part such that the total error becomes V$_A$/4 +((V$_A$+V$_c$)/2)/2+V$_c$/4=(V$_A$+V$_c$)/2. Thus, the maximum error when a comparison is made in the sense amplifier part is V$_A$−(V$_A$+V$_c$)/2=(V$_A$−V$_c$)/2 and V$_c$−(V$_A$+V$_c$)=(V$_c$−V$_A$)/2. This is to say that the maximum error is one half of the situation with prior art memory devices.

In the example described above, the three divided capacitors were distributed into the left-hand, center and right-hand parts with ferroelectric materials divided at the ratio of 1/4:1/2:1/4, but the invention is not limited by this mode of division and/or distribution. Depending on the pattern of errors due to external forces on the semiconductor memory device, divided capacitors may be distributed into two parts or four parts, and their positions may be suitably varied such that errors can be minimized. The ratio of division, too, may be suitably varied, depending on the pattern of errors.

FIGS. 6 and 7 show another semiconductor device embodying this invention. The device described above with reference to FIGS. 1 and 2 may be characterized wherein only the ferroelectric reference load capacitors /C$_{refj}$, C$_{refj}$, /C$_{BLj}$ and C$_{BLj}$ of the reference cell preset circuit 16 are divided and distributed apart in different parts of the device. The device shown in FIGS. 6 and 7 may be characterized as having a plurality of reference cell preset circuit parts, each of which having its ferroelectric reference and load capacitors /C$_{rej}$, C$_{refj}$, /C$_{BLj}$ and C$_{BLj}$ divided and distributed in different parts of the device. Explained more in detail, the device shown in FIGS. 6 and 7 has three reference cell preset circuits 16A, 16B and 16C distributed respectively to the left-hand part, the center part and the right-hand part of the device. The circuit 16A on the left-hand side comprises ferroelectric capacitors /C$_{refja}$ and C$_{refja}$ obtained by dividing a ferroelectric reference capacitor and ferroelectric capacitors /C$_{BLja}$ and C$_{BLja}$ obtained by dividing a ferroelectric load capacitor. In other respect, the circuit 16A is structured in the same way as the circuit 16 of FIG. 1.

Circuits 16B and 16C are also structured similarly, that is, the circuit 16B comprises ferroelectric capacitors /C$_{refjb}$ and C$_{refjb}$ obtained by dividing a ferroelectric reference capacitor and ferroelectric capacitors /C$_{BLjb}$ and C$_{BLjb}$ obtained by dividing a ferroelectric load capacitor and the circuit 16C comprises ferroelectric capacitors /C$_{refjc}$ and C$_{refjc}$ obtained by dividing a ferroelectric reference capacitor and ferroelectric capacitors /C$_{BLjc}$ and C$_{BLjc}$ obtained by dividing a ferroelectric load capacitor.

The reference cell preset circuit parts 16A, 16B and 16C are each adapted to generate voltages according to the divided ferroelectric capacitors but since they are driven simultaneously by the reference cell driving circuit 17, they function as a whole in the same way as the reference cell preset circuit part 16 shown in FIG. 2. Since the ferroelectric reference and load capacitors /C$_{refj}$, C$_{refj}$, /C$_{BLj}$ and C$_{BLj}$ are all divided and scattered apart, errors due to external forces can be reduced as explained above with reference to the first embodiment of this invention.

The semiconductor memory device according to the second embodiment of this invention has more components, when looked at in the direction of the bit lines (the direction from memory cell M$_{11}$ to memory cell M$_{ml}$), because there are more than one reference cell preset circuit parts. When looked at in the direction of the word lines (the direction from memory cell M$_{11}$ to memory cell M$_{ln}$), however, wiring for n columns for connecting divided ferroelectric capacitors can be dispensed with. In the case of a very large semiconductor memory device with many memory cells, therefore, a design according to the second embodiment of this invention can reduce the size in the direction of the word lines and a more compact device can be obtained.

In summary, a semiconductor device embodying this invention may be characterized as not having its ferroelectric reference capacitors and ferroelectric load capacitors all disposed in one part of the device but forming each of them with a plurality of ferroelectric capacitors and having them disposed at different parts of the device such that effects of voltage shifts due, for example, to external forces can be reduced. Explained more in detail, one of the advantages of this invention is that semiconductor devices embodying this invention can be packaged inexpensively because they are less strongly affected by external forces. For example, steps in the production process for providing pressure cushion can be dispensed with and assembly processes can be simplified. Another advantage is that the so-called endurance of the ferroelectric material (or the number of rewrite frequencies) can be improved because the voltage error due to external forces is reduced and the lowering of the read-out margin of ferroelectric capacitors can be prevented. Thirdly, since the effects of forces due to heat can also be reduced according to this invention, temperature characteristics of the device can also be improved. Fourthly, although fluctuations result during production processes in different kinds of characteristics such as hysteresis characteristics between memory cells in the direction of the bit lines, similar fluctuations are generated in the ferroelectric reference capacitors such that their effects tend to cancel each other. In the past, the number of memory cells had to be limited because of the fluctuations between the memory cells but since their fluctuations can be cancelled, more memory cells can be carried on a chip of the same size. Fifthly, the effects of fluctuations inside the chip within the wafer surface of a ferroelectric thin film can similarly be cancelled and hence the yield in the production process can also be improved.

What is claimed is:

1. A semiconductor memory device comprising:

a plurality of memory cells each having a ferroelectric memory capacitor, said memory cells being arranged in a matrix formation in rows and columns; and read-out means each associated with one of said rows for reading out data stored in a selected one of the memory cells in said associated row based on voltages generated by the ferroelectric capacitor of said selected memory cell and a plurality of divided ferroelectric capacitors which are distributed in the direction of said rows, said read-out means comprising a ferroelectric reference capacitor, and a second load capacitor which is electrically connected with the ferroelectric memory capacitor of said memory cells, said plurality of divided ferroelectric capacitors synthesizing at least one of the capacitors selected from the group consisting of said ferroelectric reference capacitor, said first load capacitor and said second load capacitor.

2. The semiconductor memory device of claim 1 wherein said divided ferroelectric capacitors together synthesize at least said ferroelectric reference capacitor.

3. The semiconductor memory service of claim 2 wherein one of said divided ferroelectric capacitors associated with said one row has about one half of the capacitance of said synthesized ferroelectric reference capacitor and is disposed near the center of the group of said memory cells on said one row, and wherein two of said divided ferroelectric capacitors associated with said one row has about one quarter of the capacitance of said synthesized ferroelectric reference capacitor and are disposed near two end parts of said group of said memory cells.

4. The semiconductor memory device of claim 1 wherein said divided ferroelectric capacitors together synthesize at least said first load capacitor.

5. The semiconductor memory device of claim 4 wherein one of said divided ferroelectric capacitors associated with said one row has about one half of the capacitance of said synthesized ferroelectric load capacitor and is disposed near the center of the group of said memory cells on said one row, and wherein two of said one row has about one quarter of the capacitance of said synthesized ferroelectric load capacitor and are disposed near two end parts of said group of said memory cells.

6. The semiconductor memory device of claim 1 wherein said divided ferroelectric capacitors together synthesize at least said secured load capacitor.

7. The semiconductor memory device of claim 6 wherein one of said divided ferroelectric capacitors associated with said one row has about one half of the capacitance of said synthesized ferroelectric load capacitor and is disposed near the center of the group of said memory cells on said one row, and wherein two of said divided ferroelectric capacitors associated with said one row has about one quarter of the capacitance of said synthesized ferroelectric load capacitor and are disposed near two end parts of said group of said memory cells.

8. A semiconductor memory device comprising:

a plurality of memory cells each having a ferroelectric memory capacitor, said memory cells being arranged in a matrix formation in rows and columns; and read-out means each associated with one of said rows for reading out data stored in a selected one of said memory cells in said associated row, said read-out means comprising a plurality of voltage generating means having divided ferroelectric capacitors and being distributed in the direction of said rows for generating a reference voltage, said read-out means comprising a ferroelectric reference capacitor, a first load capacitor which is electrically connected in series with said ferroelectric reference capacitor, and a second load capacitor which is electrically connected with the ferroelectric reference memory capacitor of said memory cells, said plurality of divided ferroelectric capacitors synthesizing at least one of the capacitors selected selected from the group consisting of said ferroelectric reference capacitor, said first load capacitor and said second load capacitor, said read-out means reading our said data on the basis of voltages generated by the ferroelectric memory capacitor of said selected memory cell and the voltage generating means of said associated row.

9. The semiconductor memory device of claim 8 wherein said divided ferroelectric capacitors together synthesize at least said ferroelectric reference capacitor.

10. The semiconductor memory device of claim 9 wherein one of said divided ferroelectric capacitors associated with said one row has about one half of the capacitance of said synthesized ferroelectric reference capacitor and is disposed near the center of the group of said memory cells on said one row, and wherein two of said divided ferroelectric capacitors associated with said one row has about one quarter of the capacitance of said synthesized ferroelectric reference capacitor and are disposed near two end parts of said group of said memory cells.

11. The semiconductor memory device of claim 8 wherein said divided ferroelectric capacitors together at least said first ferroelectric load capacitor.

12. The semiconductor memory device of claim 11 wherein one of said divided ferroelectric capacitors associated with said one row has about one half of the capacitance of said synthesized ferroelectric load capacitor and is disposed near the center of the group of said memory cells on said one row, and wherein two of said divided ferroelectric capacitors associated with said one row has about one quarter of the capacitance of said synthesized ferroelectric load capacitor and are disposed near two end parts of said group of said memory cells.

13. The semiconductor memory device of claim 8 wherein said divided ferroelectric capacitors together at least said second ferroelectric load capacitor.

14. The semiconductor memory device of claim 13 wherein one of said divided ferroelectric capacitors associated with said one row has about one half of the capacitance of said synthesized ferroelectric load capacitor and is disposed near the center of the group of said memory cells on said one row, and wherein two of said divided ferroelectric capacitors associated with said one row has about one quarter of the capacitance of said synthesized ferroelectric load capacitor and are disposed near two end parts of said group of said memory cells.

* * * * *